(12) United States Patent  (10) Patent No.: US 8,045,080 B2
Lee et al.  (45) Date of Patent: *Oct. 25, 2011

(54) THIN FILM TRANSISTOR ARRAY PANEL AND A METHOD FOR MANUFACTURING THE SAME

(75) Inventors: Young-Wook Lee, Suwon-si (KR); Jang-Soo Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 54 days.

This patent is subject to a terminal disclaimer.

(21) Appl. No.: 12/548,897

(22) Filed: Aug. 27, 2009

(65) Prior Publication Data

US 2009/0315033 A1    Dec. 24, 2009

Related U.S. Application Data

(63) Continuation of application No. 11/487,837, filed on Jul. 17, 2006, now Pat. No. 7,599,015.

(30) Foreign Application Priority Data

Aug. 26, 2005   (KR) .......................... 10-2005-0078742

(51) Int. Cl.
*G02F 1/136* (2006.01)
(52) U.S. Cl. ......................................... 349/43; 349/143
(58) Field of Classification Search .................. None
See application file for complete search history.

(56) References Cited

U.S. PATENT DOCUMENTS

| | | | |
|---|---|---|---|
| 6,697,138 B2 * | 2/2004 | Ha et al. | 349/114 |
| 7,190,419 B2 | 3/2007 | Park | |
| 7,211,827 B2 | 5/2007 | Lee et al. | |
| 7,528,917 B2 | 5/2009 | Kim et al. | |
| 7,599,015 B2 * | 10/2009 | Lee et al. | 349/43 |
| 7,852,444 B2 * | 12/2010 | Song | 349/141 |
| 7,858,452 B2 * | 12/2010 | Park | 438/149 |
| 2004/0070717 A1 | 4/2004 | Hong et al. | |
| 2004/0105051 A1 | 6/2004 | Chuang et al. | |
| 2009/0079888 A1 | 3/2009 | Nakayoshi et al. | |

FOREIGN PATENT DOCUMENTS

| | | |
|---|---|---|
| JP | 2000-111957 | 4/2000 |
| JP | 2000-292801 | 10/2000 |
| JP | 2002-258262 | 9/2002 |
| JP | 2003-131240 | 5/2003 |
| KR | 1999-0035922 | 5/1999 |
| KR | 1020020063498 | 8/2002 |
| KR | 1020040084488 | 10/2004 |

* cited by examiner

*Primary Examiner* — Sarah Hahm
(74) *Attorney, Agent, or Firm* — F. Chau & Associates, LLC

(57) ABSTRACT

A thin film transistor array panel includes a substrate; a plurality of gate lines that are formed on the substrate; a plurality of data lines that intersect the gate lines; a plurality of thin film transistors that are connected to the gate lines and the data lines; a plurality of color filters that are formed on upper parts of the gate lines, the data lines, and the thin film transistors; a common electrode that is formed on the color filters and that includes a transparent conductor; a passivation layer that is formed on an upper part of the common electrode; and a plurality of pixel electrodes that are formed on an upper part of the passivation layer and that are connected to a drain electrode of each of the thin film transistors.

57 Claims, 14 Drawing Sheets

THIN FILM TRANSISTOR ARRAY PANEL AND A METHOD FOR MANUFACTURING THE SAME

CROSS-REFERENCE TO RELATED APPLICATION

This application is a Continuation of U.S. application Ser. No. 11/487,837 filed on Jul. 17, 2006, now U.S. Pat. No. 7,599,015 which claims priority to Korean Patent Application No. 10-2005-0078742, filed in the Korean Intellectual Property Office on Aug. 26, 2005, the disclosures of which are incorporated by reference herein in their entirety.

BACKGROUND OF THE INVENTION

1. Technical Field

The present invention relates to a thin film transistor array panel, and more particularly, to a thin film transistor array panel that uses one substrate of a liquid crystal display and a method of manufacturing the same.

2. Discussion of the Related Art

A liquid crystal display is one of the most widely used flat panel displays. For example, a liquid crystal display is commonly found in a variety of electronic devices such as flat screen televisions, laptop computers, cell phones, and digital cameras.

A liquid crystal display includes two display panels that are formed with a field generating electrode such as a pixel electrode and a common electrode and a liquid crystal layer interposed therebetween. The liquid crystal display displays images by applying a voltage to the field generating electrode to generate an electric field in the liquid crystal layer. The electric field determines alignment of liquid crystal molecules in the liquid crystal layer to control polarization of incident light.

In general, a gate line for transferring a gate signal or a scanning signal, a data line for transferring an image signal or a data signal, a pixel electrode for receiving the image signal, and a thin film transistor for controlling the image signal that is transferred to a pixel electrode of each pixel are formed in a first display panel. Red, green, and blue color filters that are arranged in each pixel to represent various color images are formed in a second display panel that faces the first display panel.

As a size of such a liquid crystal display increases, the display panels can become erroneously aligned during a manufacturing process. Erroneous alignment can lead to deterioration of a contrast ratio and a mixed color phenomenon. To compensate for this, a width of a black matrix that is formed between the pixels is increased. However, as the width of the black matrix increases, an aperture ratio of the pixels decreases.

Accordingly, there is a need for a liquid crystal display that is capable of preventing erroneous alignment of display panels while maintaining an aperture ratio of the pixels.

SUMMARY OF THE INVENTION

An exemplary embodiment of the present invention provides a thin film transistor array panel including: a substrate; a plurality of gate lines that are formed on the substrate; a plurality of data lines that intersect the gate lines; a plurality of thin film transistors that are connected to the gate lines and the data lines; a plurality of color filters that are formed on upper parts of the gate lines, the data lines, and the thin film transistors; a common electrode that is formed on the color filters and that includes a transparent conductor; a passivation layer that is formed on an upper part of the common electrode; and a plurality of pixel electrodes that are formed on an upper part of the passivation layer and that are connected to a drain electrode of each of the thin film transistors.

Each of the pixel electrodes may include a plurality of branch electrodes that are inclined at an angle to at least one of the gate lines or at least one of the data lines, and a connection part for connecting the plurality of branch electrodes.

Each of the branch electrodes may be arranged symmetrically around a center line of the pixel electrode that is parallel to one of the gate lines.

The color filter has an opening and the passivation layer may have a contact hole that exposes the drain electrode through the opening.

The common electrode may have an opening that is smaller than the contact hole and that exposes a part of the color filter on an upper part of the drain electrode, and the passivation layer may completely cover the opening of the common electrode.

The thin film transistor array panel may further include a common signal line that is formed in a same layer as the gate lines and that is electrically connected to the common electrode.

The passivation layer may have a first contact hole and the common electrode may have a second contact hole that exposes the common signal line through the first contact hole, and a contact member for connecting the common signal line and the common electrode through the first and second contact holes may be formed in a same layer as the pixel electrodes.

Another exemplary embodiment of the present invention provides a method of manufacturing a thin film transistor array panel including: forming a gate line on an insulation substrate; forming a gate insulating layer covering the gate line; forming a semiconductor on an upper part of the gate insulating layer; forming a data line and a drain electrode in an upper part of the gate insulating layer, the data line having a source electrode; forming a color filter on upper parts of the data line and the drain electrode; forming a common electrode on an upper part of the color filter; forming a passivation layer covering the common electrode; and forming a pixel electrode on an upper part of the passivation layer.

The passivation layer may be made of benzocyclobutene (BCB) or acryl.

A common signal line may be formed when forming the gate line.

The passivation layer may have a first contact hole and the common electrode may have a second contact hole that exposes a common signal line through the first contact hole. In this case, the method may further include forming a contact member for connecting the common signal line and the common electrode through the first and second contact holes in a same layer as the pixel electrode.

The common electrode may be made of poly-crystalline or amorphous indium tin oxide (ITO) or indium zinc oxide (IZO).

Yet another exemplary embodiment of the present invention provides a thin film transistor array panel including: a substrate; a plurality of gate lines formed on the substrate; a plurality of data lines intersecting the gate lines; a plurality of thin film transistors connected to the gate lines and the data lines; a plurality of color filters formed above of the gate lines, the data lines, and the thin film transistors; a common electrode formed on the color filters; a first passivation layer formed on an upper part of the common electrode; a second passivation layer formed on an upper part of a drain electrode of each of the thin film transistors; and a plurality of pixel electrodes formed on an upper part of the first passivation layer and that are electrically connected to the drain electrode through an opening.

The common electrode includes an opening exposing a part of the color filter, and a part of the first passivation layer overlaps the opening exposing the part of the color filter to form a side of the opening through which the pixel electrodes are electrically connected to the drain electrode.

Each of the pixel electrodes includes a plurality of branch electrodes disposed in first and second directions.

The first passivation layer has a first contact hole, the common electrode has a second contact hole, and the second passivation layer has a third contact hole that exposes the common signal line through the first and second contact holes, wherein a contact member for connecting the common signal line and the common electrode through the first, second and third contact holes is formed in a same layer as the pixel electrodes.

DETAILED DESCRIPTION OF EXEMPLARY EMBODIMENTS

The present invention will now be described more fully hereinafter with reference to the accompanying drawings, in which exemplary embodiments of the invention are shown. The present invention may, however, be embodied in many different forms and should not be construed as limited to the embodiments set forth herein.

A thin film transistor array panel according to an exemplary embodiment of the present invention will be described in detail with reference to FIGS. 1 to 4.

Figure 1:
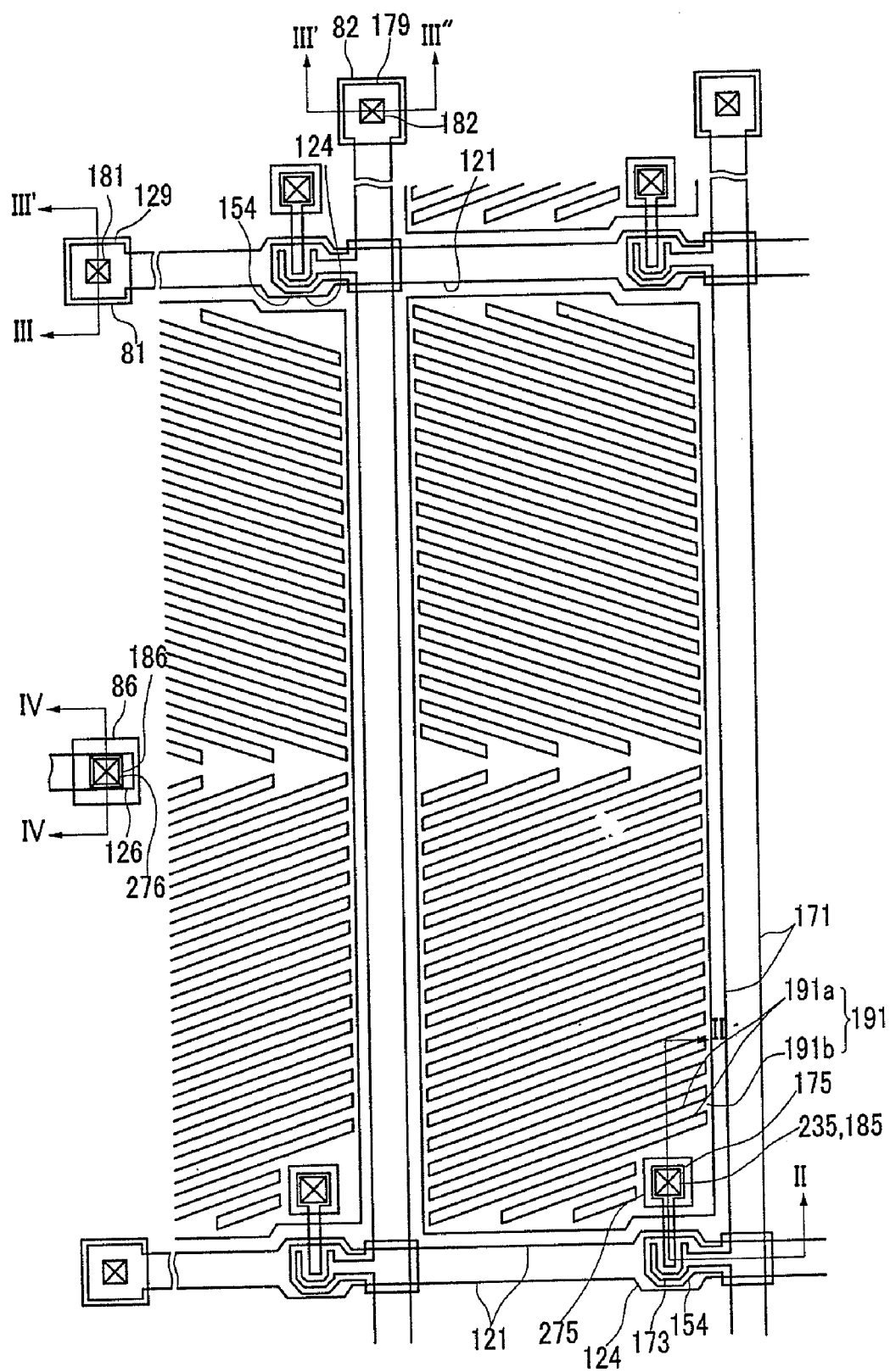
FIG. 1 is a layout view of a thin film transistor array panel for a liquid crystal display according to an exemplary embodiment of the present invention.
Figure 2:
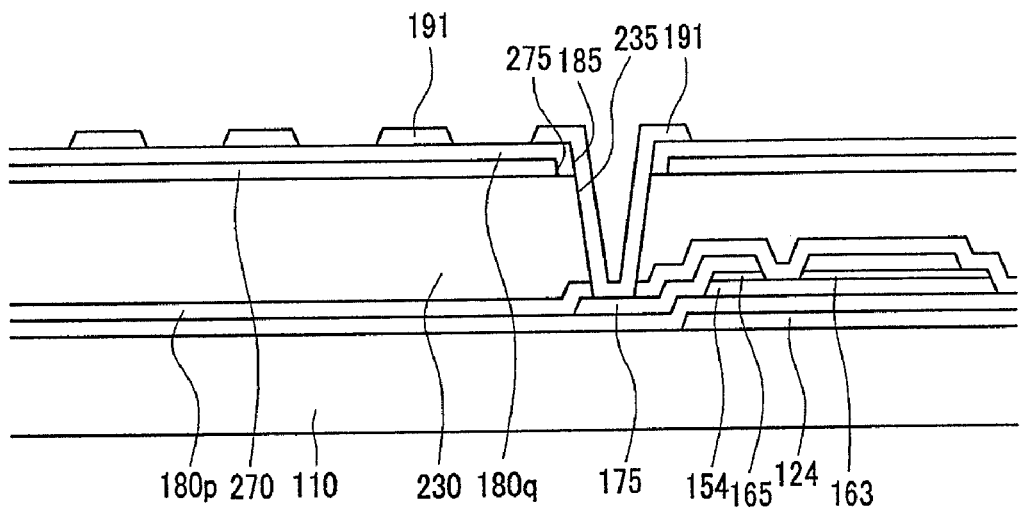
FIGS. 2 to 4 are cross-sectional views of the thin film transistor array panel taken along lines II-II, III-III'-III", and IV-IV of FIG. 1, respectively.
Figure 3:
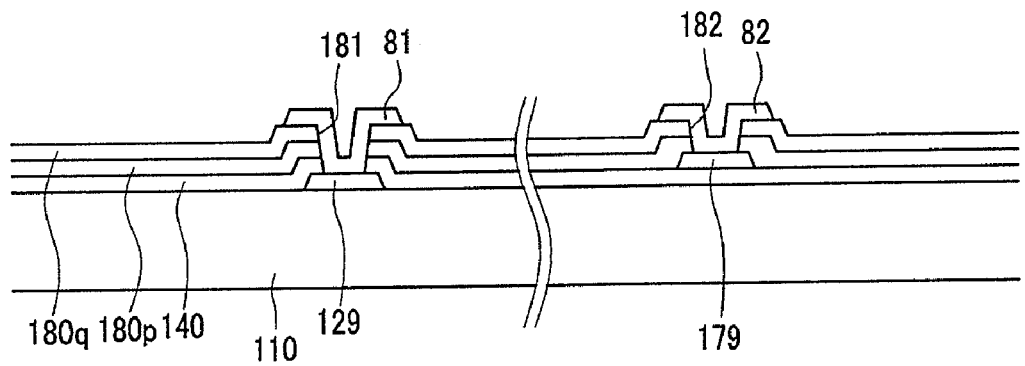
Figure 4:
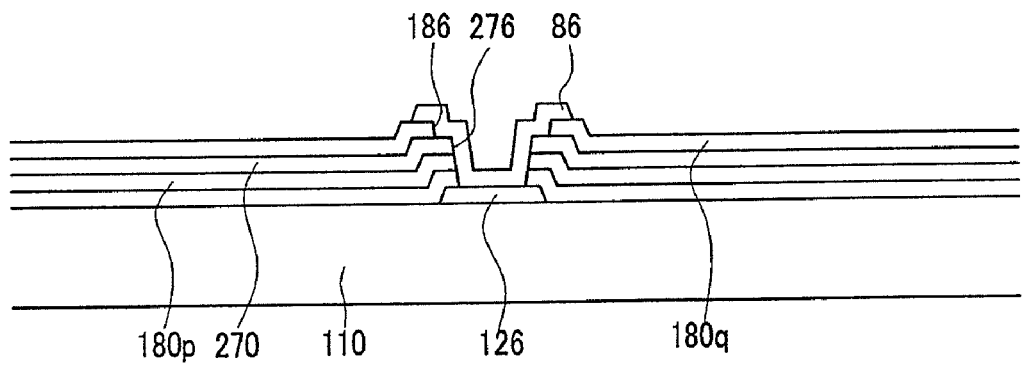

FIG. 1 is a layout view of a thin film transistor array panel for a liquid crystal display according to an exemplary embodiment of the present invention. FIGS. 2 to 4 are cross-sectional views of the thin film transistor array panel taken along lines II-II, III-III'-III", and IV-IV of FIG. 1, respectively.

A plurality of gate lines 121 and a common signal line 126 are formed on an insulating substrate 110 that is made of transparent glass, plastic, and so forth.

Each gate line 121 transfers a gate signal and is extended in a horizontal direction. Each gate line 121 includes a plurality of gate electrodes 124 that are protruded in a vertical direction, and a wide end part 129 for connecting to other layers or an external driving circuit. A gate driving circuit (not shown) that generates a gate signal may be mounted on a flexible printed circuit film (not shown) that is attached to the substrate 110, directly mounted on the substrate 110, or integrated in the substrate 110. When the gate driving circuit is integrated in the substrate 110, the gate line 121 is extended to directly connect to the circuit.

The common signal line 126 transfers a common voltage that is input from the outside and is positioned adjacent to the end part 129 of the gate line 121. The common signal line 126 is formed in the same layer as the gate line 121 and may have an expanding part, as needed.

The gate line 121 and the common signal line 126 may be made of aluminum metals such as aluminum (Al) or an aluminum alloy, silver metals such as silver (Ag) or a silver alloy, copper metals such as copper (Cu) or a copper alloy, molybdenum metals such as molybdenum (Mo) or a molybdenum alloy, chromium (Cr), thallium (Ta), titanium (Ti), and so forth. However, the gate line 121 and the common signal line 126 may have a multi-layered structure including two conductive layers (not shown) that have different physical properties. One conductive layer is made of metals having low resistivity, for example aluminum metals, silver metals, copper metals, and so forth, to reduce a signal delay or a voltage drop. Alternatively, the other conductive layer is made of a material such as a molybdenum metal, chromium, thallium, titanium, and so forth, that have excellent physical, chemical, and electrical contact characteristics with other materials, specifically indium tin oxide (ITO) and indium zinc oxide (IZO). Exemplary combinations of the multi-layered structure may include a chromium lower layer and an aluminum (alloy) upper layer, and an aluminum (alloy) lower layer and a molybdenum (alloy) upper layer. However, the gate line 121 and the common signal line 126 may made of various metals or electrical conductors, in addition to the above-described materials.

Side surfaces of the gate line 121 and the common signal line 126 are inclined to a surface of the substrate 110, and an inclination angle thereof is preferably about 30° to about 80°.

A gate insulating layer 140 that is made of silicon nitride (SiNx), silicon oxide (SiOx), and so forth is formed on the gate line 121 and the common signal line 126.

A plurality of semiconductor islands 154 that are made of hydrogenated amorphous silicon (a-Si), polysilicon, and so forth are formed on the gate insulating layer 140. Each semiconductor island 154 is positioned on a gate electrode 124 and includes an extension that covers a border of the gate line 121.

A plurality of ohmic contacts 163 and 165 are formed on the semiconductor islands 154. The ohmic contacts 163 and 165 may be made of a material such as n+ hydrogenated amorphous silicon in which an n-type impurity such as phosphorus is doped with a high concentration or silicide. The ohmic contacts 163 and 165 are formed in pairs and are disposed on the semiconductor islands 154.

Side surfaces of the semiconductor islands 154 and the ohmic contacts 163 and 165 are also inclined with respect to a surface of the substrate 110, and an inclination angle thereof is about 30° to about 80°.

A plurality of data lines 171 and a plurality of drain electrodes 175 are formed on the ohmic contacts 163 and 165 and the gate insulating layer 140.

Each data line 171 transfers a data signal and is extended in a vertical direction to intersect the gate lines 121. Each data line 171 includes a plurality of source electrodes 173 that are extended toward the gate electrode 124, and a wide end part 179 for connecting to other layers or an external driving circuit. A data driving circuit (not shown) that generates a data signal may be mounted on a flexible printed circuit film (not shown) that is attached to the substrate 110, directly mounted on the substrate 110, or integrated in the substrate 110. When the data driving circuit is integrated in the substrate 110, the data line 171 can be extended to directly connect to the circuit.

The drain electrode 175 is separated from the data line 171 and faces the source electrode 173 around the gate electrode 124.

One gate electrode 124, one source electrode 173, one drain electrode 175, and the semiconductor island 154 constitute one thin film transistor (TFT), and a channel of the thin film transistor is formed in the semiconductor island 154 between the source electrode 173 and the drain electrode 175.

It is preferable that the data line 171 and the drain electrode 175 are made of a refractory metal such as molybdenum, chromium, thallium, and titanium, or their alloys. The data line 171 and the drain electrode 175 can have a multi-layered structure including a refractory metal layer (not shown) and a low resistance conductive layer (not shown). Examples of the multi-layered structures include, for example, a dual layer of a chromium or molybdenum (alloy) lower layer and an aluminum (alloy) upper layer, and a triple layer of a molybdenum (alloy) lower layer, an aluminum (alloy) intermediate layer, and a molybdenum (alloy) upper layer. However, the data lines 171 and the drain electrodes 175 may be made of various metals or electric conductors, in addition to the above-described materials.

The ohmic contacts 163 and 165 exist only between the underlying semiconductor islands 154 and the overlying data line 171 and the drain electrode 175 to reduce a contact resistance therebetween. An extension of the semiconductor island 154 that is positioned on the gate line 121 smoothes a surface profile thereof, thereby preventing the data line 171 from being disconnected. The semiconductor island 154 has portions that are exposed between the source electrode 173 and the drain electrode 175 that are not covered by the data line 171 and the drain electrode 175.

The common signal line 126 is disposed in the same layer as the gate line 121, but it may be disposed in the same layer as the data line 171.

A lower passivation layer 180*p* is formed on the data line 171, the drain electrode 175, and the exposed portions of the semiconductor island 154. The lower passivation layer 180*p* is made of non-organic insulators, and the non-organic insulators include, for example, silicon nitride and silicon oxide. However, the lower passivation layer 180*p* can have a dual-layer structure of a lower inorganic layer and an upper organic layer to prevent the exposed portions of the semiconductor island 154 from being damaged while having excellent insulating characteristics of the organic layer.

A plurality of color filters 230 are formed on the lower passivation layer 180*p*.

Most of the color filters 230 exist in an area that is surrounded with the gate lines 121 and the data lines 171, and the color filters 230 have an opening 235 for exposing a part of the drain electrode 175. The color filters 230 can be formed in a band shape by extending them in a vertical direction along a column of a pixel electrode 191. The color filters 230 can have a side wall of a tapered structure on an upper part of the data line 171, and neighboring edges thereof can become flat by overlapping each other or can be used as a light blocking member for blocking light. Each color filter 230 can display one of three primary colors consisting of red, green, and blue.

The lower passivation layer 180*p* may be omitted.

A common electrode 270 for receiving a common signal is formed on upper parts of the lower passivation layer 180*p* and the color filters 230. As shown in FIG. 4, the common electrode 270 has a contact hole 276 for exposing the common signal line 126 through the gate insulating layer 140 and the lower passivation layer 180*p,* and as shown in FIG. 2, the common electrode 270 has an opening 275 for exposing the color filter 230 on the upper part of the drain electrode 175. The opening 275 of the common electrode 270 exposes a part of the color filter 230 for defining the opening 235 of the color filter 230. The common electrode 270 is made of a transparent conductive material such as poly-crystalline, mono-crystalline, or amorphous ITO and IZO. The common electrode 270 is formed in an area surrounded with the gate line 121 and the data line 171, and is removed in an area in which end parts 129 and 179 of the gate line 121 and the data line 171 are disposed.

An upper passivation layer 810*q* that is made of an organic insulating material or an inorganic insulating material such as silicon oxide or silicon nitride is formed on upper parts of the common electrode 270, the exposed color filter 230, and the lower passivation layer 180*p*. The organic insulator may preferably have a dielectric constant of about 4.0 or less, and may have photosensitivity, provide a flat surface, and be made of benzocyclobutene (BCB) or an acryl having excellent uniformity.

A plurality of contact holes 182 for exposing the end part 179 of the data line 171 through the lower passivation layer 180*p* and a plurality of contact holes 185 for exposing the drain electrode 175 through the opening 235 of the color filter 230 are formed in the upper passivation layer 180*q*. A plurality of contact holes 181 for exposing the end part 129 of the gate line 121 are formed in the upper passivation layer 180*q,* the lower passivation layer 180*p,* and the gate insulating layer 140. Furthermore, the upper passivation layer 180*q* has a contact hole 186 for exposing a part of the common electrode 270 that defines the contact hole 276 of the common electrode 270 and for exposing the common signal line 126.

A plurality of pixel electrodes 191 and a plurality of contact assistants 81, 82, and 86 are formed on the upper passivation layer 180*q*. They may be made of a transparent conductive material such as poly-crystalline or amorphous ITO and IZO.

The pixel electrode 191 is extended in a horizontal direction, and includes a plurality of branch electrodes 191*a* that overlap the common electrode 270 and includes a connection part 191*b* around the plurality of branch electrodes 191*a* that commonly connects the plurality of branch electrodes 191*a*.

Each branch electrode 191*a* is inclined to the gate line 121 or is in a horizontal direction at a predetermined angle, and is arranged symmetrically around a horizontal center line of the pixel electrode 191 that is parallel to the gate line 121.

An outer border of the connection part 191*b* that defines a border of the pixel electrode 191 has a rectangular shape.

The pixel electrode 191 is physically and electrically connected to the drain electrode 175 through the contact hole 185 and the opening 235 to receive a data voltage from the drain electrode 175. Because the upper passivation layer 180*q* that defines the contact hole 185 completely covers the opening 275 of the common electrode 270, the pixel electrode 191 and the common electrode 270 are isolated from each other.

The pixel electrode 191 to which a data voltage is applied and the common electrode 270 to which a common voltage is applied generate an electric field, thereby determining a direction of liquid crystal molecules of a liquid crystal layer (not shown) that is positioned between the two electrodes 191 and 270. Polarization of light that passes through the liquid crystal layer changes depending on a direction of the liquid crystal molecules.

The pixel electrode 191 and the common electrode 270 constitute a liquid crystal capacitor by using the liquid crystal layer as a dielectric material, thereby maintaining an applied voltage even after a thin film transistor is turned off. The electrodes 191 and 270 also constitute a storage capacitor by using the upper passivation layer 180$q$ as a dielectric material, thereby strengthening voltage sustainability of the liquid crystal capacitor.

The contact assistants 81 and 82 are connected to the end part 129 of the gate line 121 and the end part 179 of the data line 171 through the contact holes 181 and 182, respectively. The contact assistants 81 and 82 complement adhesion between the end part 129 of the gate line 121 and the end part 179 of the data line 171 and an outside apparatus, and protect them.

Furthermore, the contact assistant 86 comes in contact with the common signal line 126 that is exposed through the contact hole 276 and the common electrode 270 that is exposed through the contact hole 186, whereby the common signal line 126 and the common electrode 270 are electrically connected to each other. The common electrode 270 receives a common voltage from the common signal line 126.

In such a thin film transistor array panel, an electric field between the common electrode 270 and the pixel electrode 191 is formed in both a parallel direction and a vertical direction of the substrate 110, such that the liquid crystal molecules are inclined while twisting. Therefore, transmittance can be improved while securing a wide viewing angle.

Furthermore, visibility can be increased by disposing the branch electrodes 191$a$ in two directions.

Since the color filter 230 is disposed on the gate line 121, the data line 171, and the thin film transistors, erroneous alignment with other display panels can be reduced even when a size of the thin film transistor array panel increases. In addition, an aperture ratio of the pixels can be improved.

Furthermore, since the common electrode 270 is positioned between the pixel electrode 191 and the data line 171, a parasitic capacitance generated between the pixel electrode 191 and the data line 171 can be reduced. Accordingly, a phenomenon in which vertical line blurs are generated can be prevented and an erroneous alignment margin between the data line 171 and the pixel electrode 191 can be reduced.

Furthermore, a sustain capacity formed between the electrodes 191 and 270 can be reduced by adjusting a thickness of the upper passivation layer 180$q$ formed between the common electrode 171 and the pixel electrode 191. Accordingly, a size of the thin film transistor can be reduced, whereby an aperture ratio of the pixels can be improved.

Now, a method of manufacturing the thin film transistor array panel shown in FIGS. 1 to 4 according to an exemplary embodiment of the present invention will be described in detail with reference to FIGS. 5 to 16$c$.

FIGS. 5, 7, 9, 11, 13, and 15 are layout views of the thin film transistor array panel of FIGS. 1 to 4 during a manufacturing process according to an exemplary embodiment of the present invention. FIGS. 6A to 6C are cross-sectional views of the thin film transistor array panel taken along lines VIa-VIa, VIb-VIb'-VIb'', and VIc-VIc of FIG. 5, respectively. FIGS. 8A to 8C are cross-sectional views of the thin film transistor array panel taken along lines VIIIa-VIIIa, VIIIb-VIIIb'-VIIIb'', and VIIc-VIIc of FIG. 7, respectively. FIGS. 10A to 10C are cross-sectional views of the thin film transistor array panel taken along lines Xa-Xa, Xb-Xb'-VIb'', and Xc-Xc of FIG. 9, respectively. FIGS. 12A to 12C are cross-sectional views of the thin film transistor array panel taken along lines XIIa-XIIa, XIIb-XIIb'-XIIb'', and XIIc-XIIc of FIG. 11, respectively. FIGS. 14A to 14C are cross-sectional views of the thin film transistor array panel taken along lines XIVa-XIVa, XIVb-XIVb'-XIVb'', and XIVc-XIVc of FIG. 13, respectively. FIGS. 16A to 16C are cross-sectional views of the thin film transistor array panel taken along lines XVIa-XVIa, XVIb-XVIb'-XVIb'', and XVIc-XVIc of FIG. 15, respectively.

Figure 5:
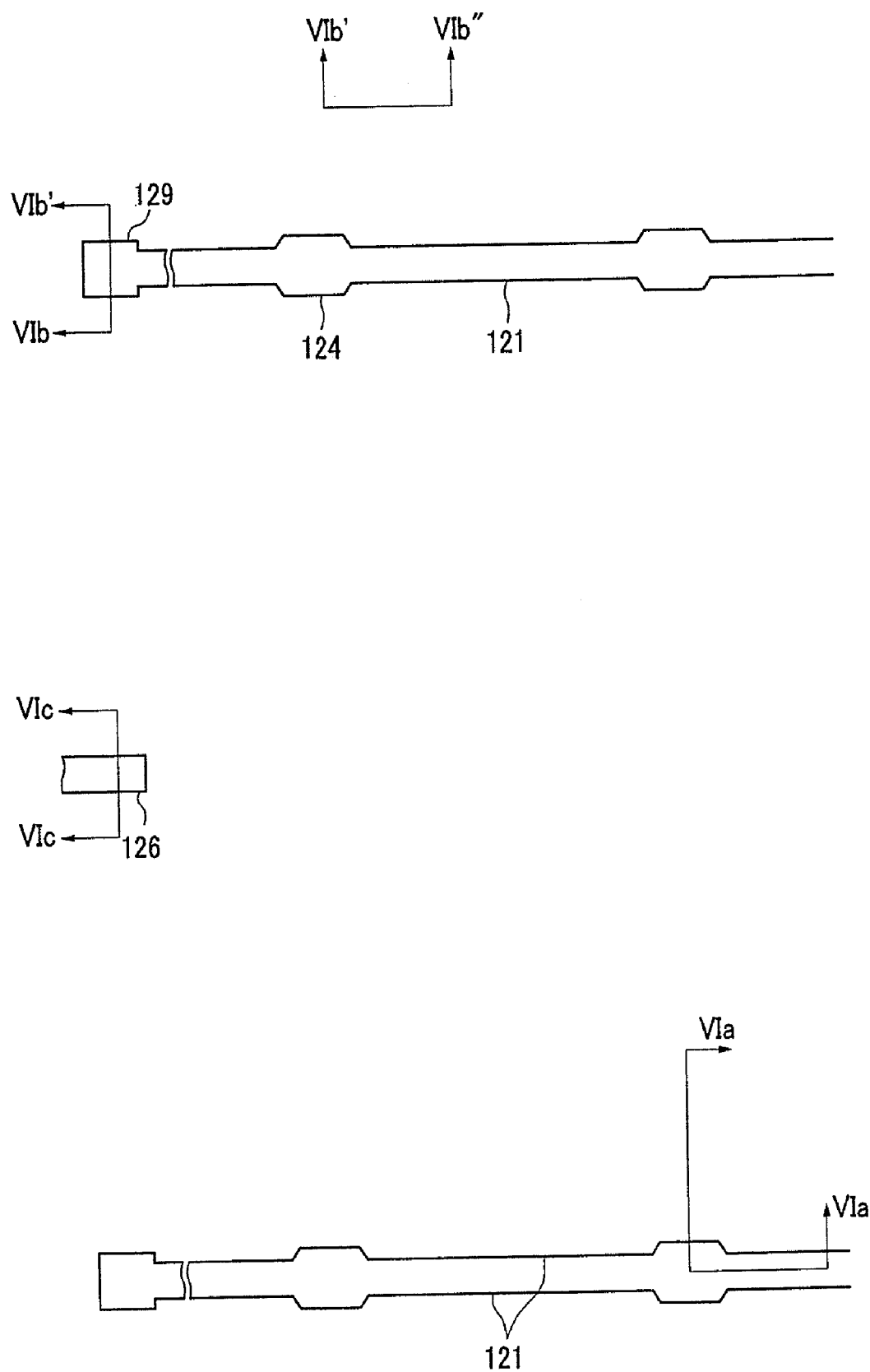
FIGS. 5, 7, 9, 11, 13, and 15 are layout views of the thin film transistor array panel of FIGS. 1 to 4 during a manufacturing process according to an exemplary embodiment of the present invention.
Figure 6A:
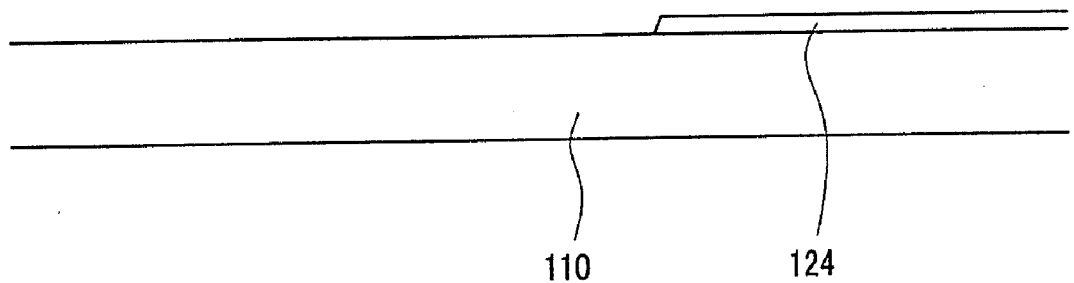
FIGS. 6A to 6C are cross-sectional views of the thin film transistor array panel taken along lines VIa-VIa, VIb-VIb'-VIb", and VIc-VIc of FIG. 5, respectively.
Figure 6B:
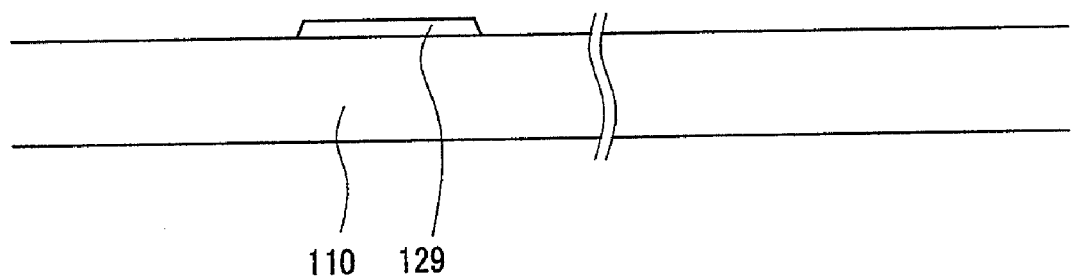
Figure 6C:
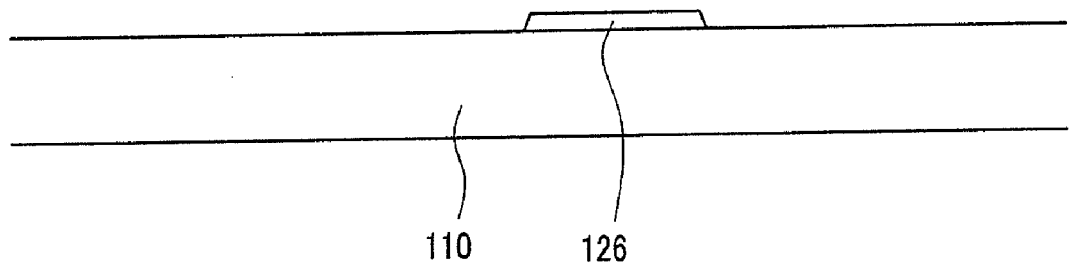

As shown in FIGS. 5 to 6C, the gate line 121 and the common signal line 126 including a plurality of gate electrodes 124 and a plurality of end parts 129 are formed by patterning with a photolithography process using a mask after stacking conductive layers by sputtering, etc., on the insulation substrate 110 that is made of transparent glass, etc.

Figure 7:
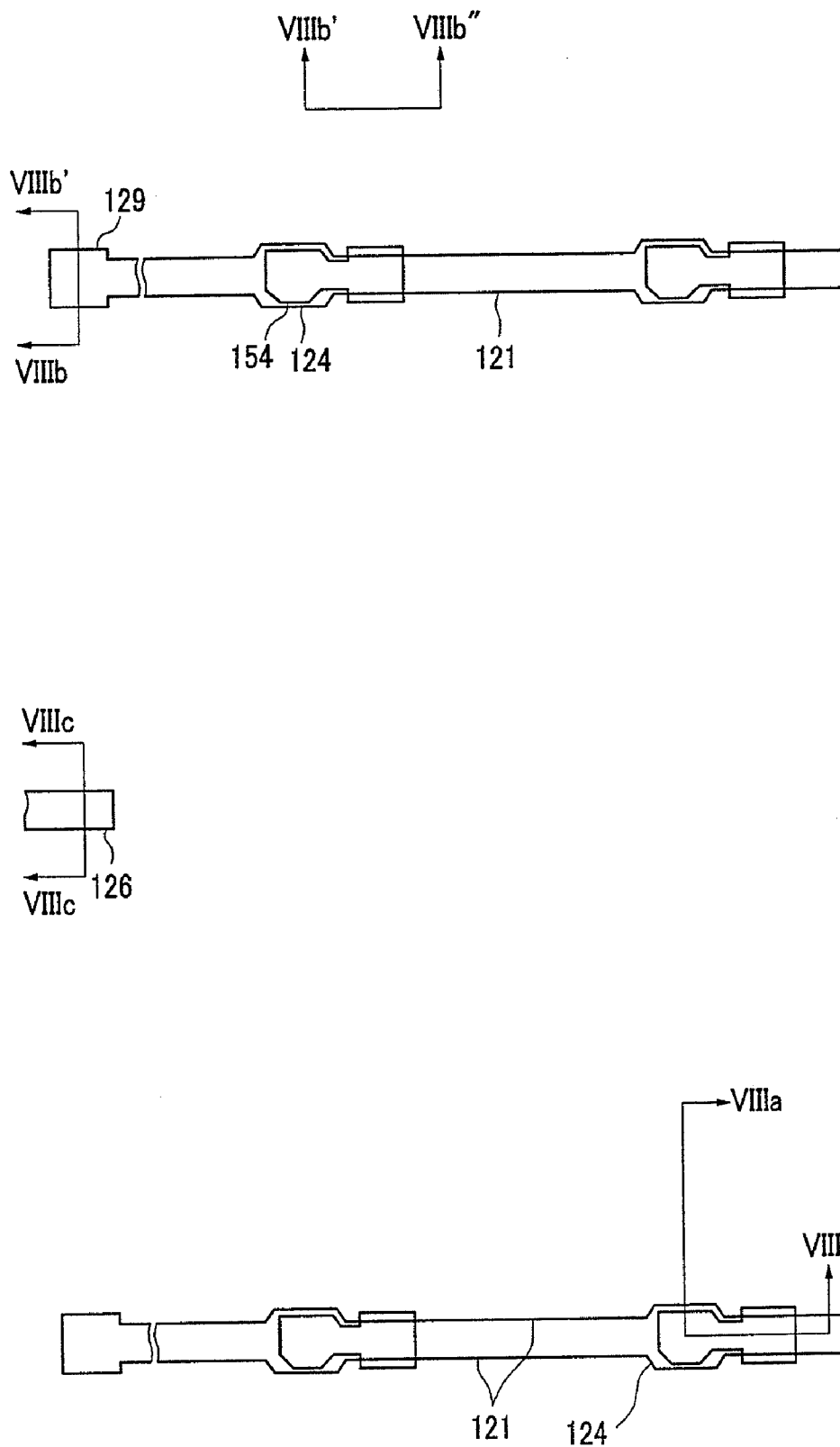
Figure 8A:
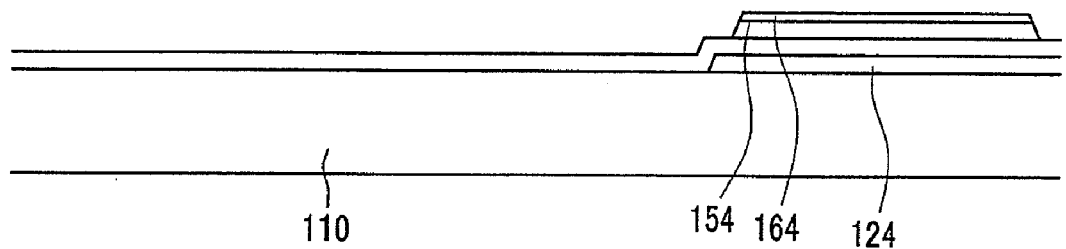
FIGS. 8A to 8C are cross-sectional views of the thin film transistor array panel taken along lines VIIIa-VIIIa, VIIIb-VIIIb'-VIIIb", and VIIIc-VIIIc of FIG. 7, respectively.
Figure 8B:
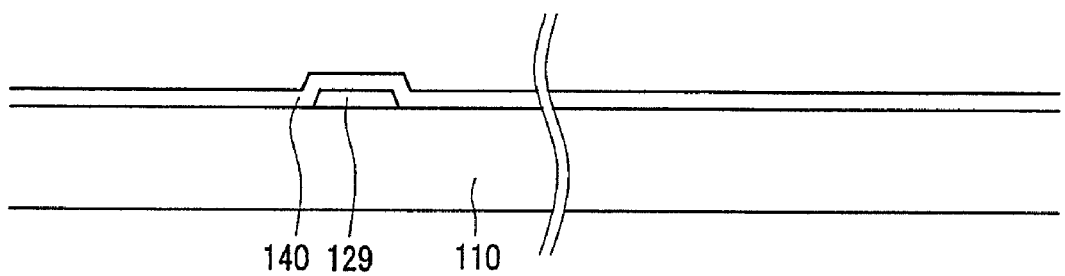
Figure 8C:
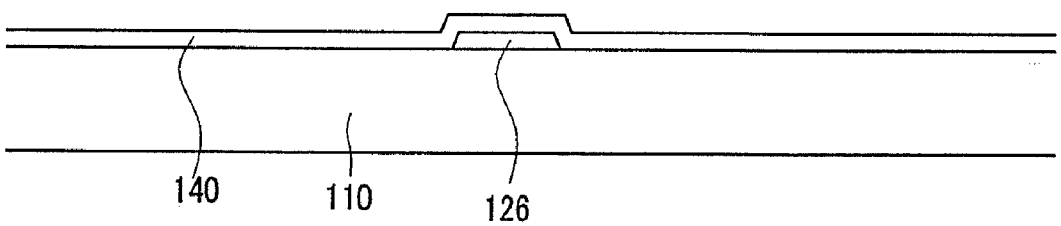

As shown in FIGS. 7 to 8C, a plurality of extrinsic semiconductor islands 164 and a plurality of intrinsic semiconductor islands 154 are formed on the gate insulating layer 140 by stacking three layers of the gate insulating layer 140 having a thickness of about 1500 Å to about 5000 Å, an intrinsic amorphous silicon having a thickness of about 500 Å to about 2000 Å, and an extrinsic amorphous silicon having a thickness of about 300 Å to about 600 Å and performing a photolithography process in the extrinsic amorphous silicon and intrinsic amorphous silicon.

Figure 9:
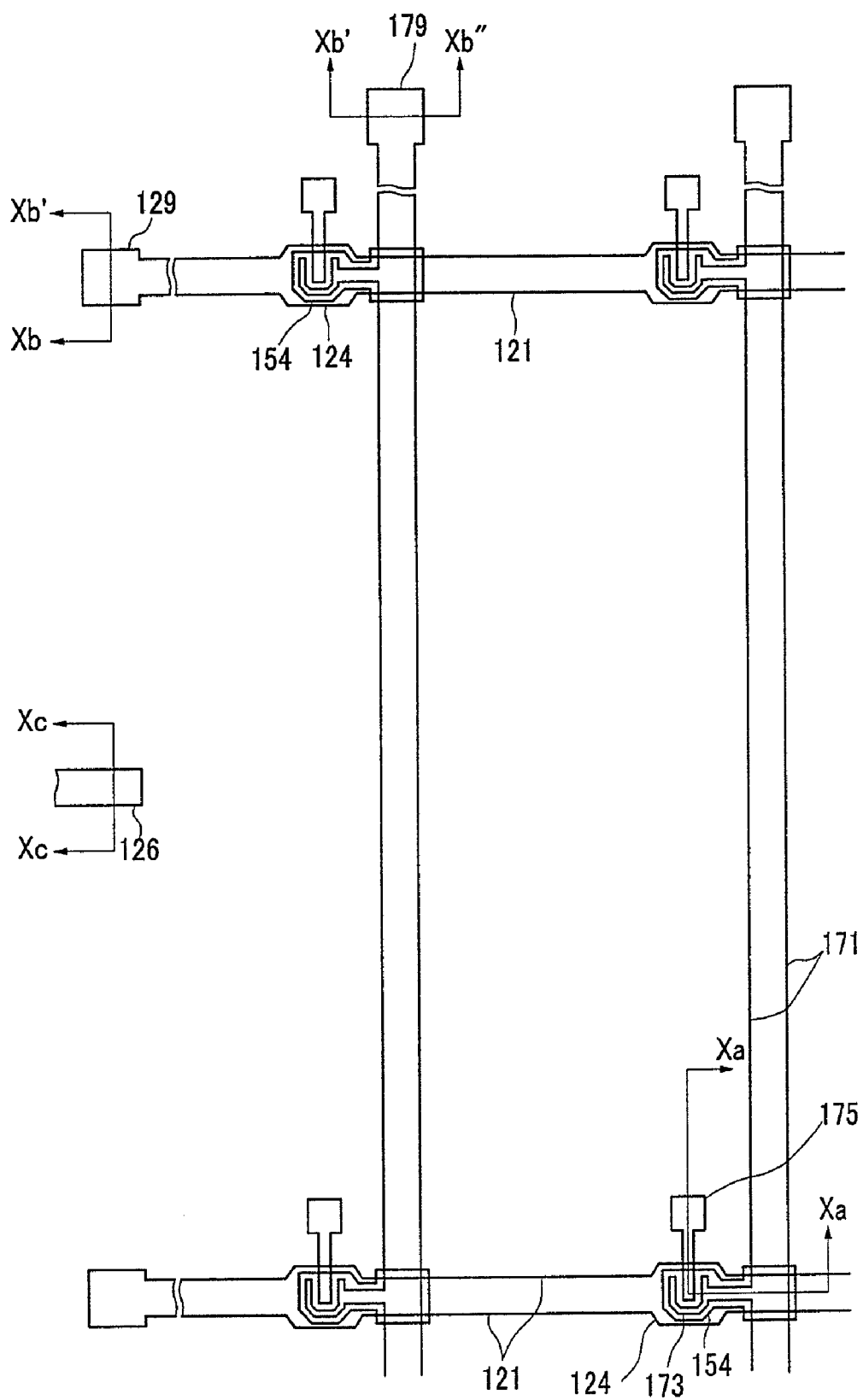
Figure 10A:
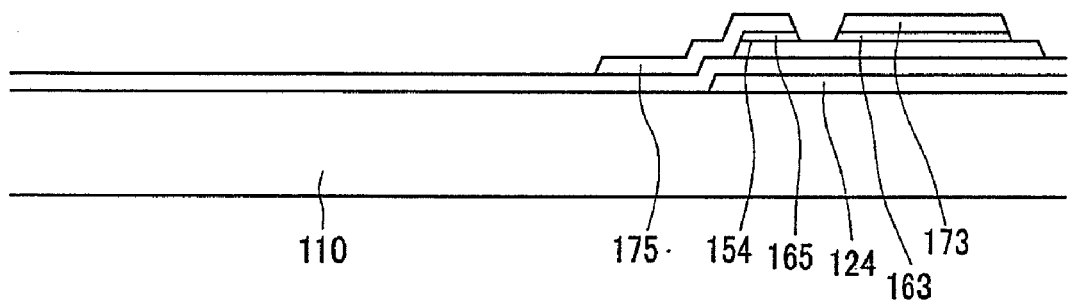
FIGS. 10A to 10C are cross-sectional views of the thin film transistor array panel taken along lines Xa-Xa, Xb-Xb'-VIb", and Xc-Xc of FIG. 9, respectively.
Figure 10B:
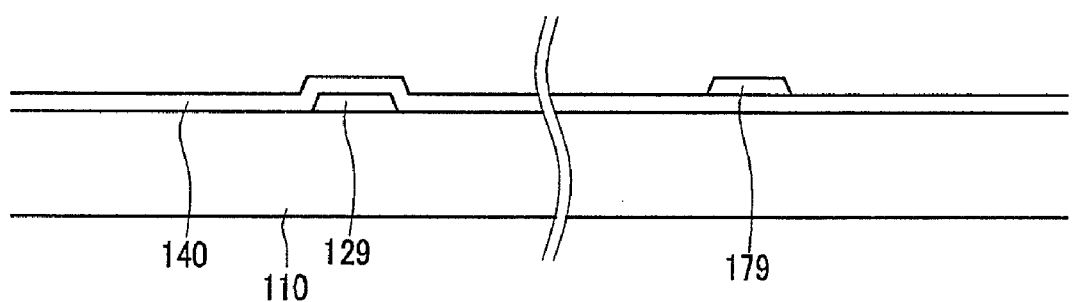
Figure 10C:
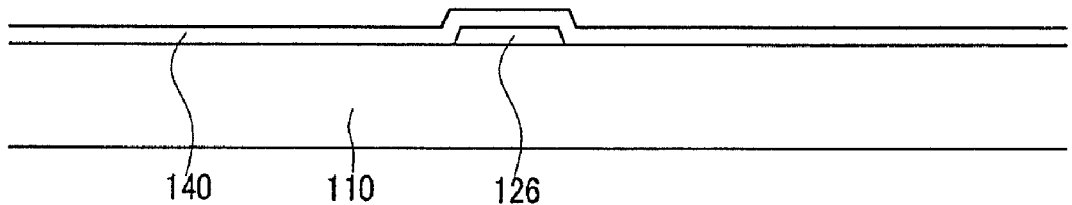

As shown in FIGS. 9 to 10C, a plurality of the data lines 171 and a plurality of the drain electrodes 175 including a plurality of source electrodes 173 and the end part 179 are formed by patterning with a dry or wet etching process after depositing a conductive layer to a thickness of about 1500 Å to about 3000 Å with a process such as sputtering.

A plurality of the ohmic contact islands 163 and 165 are formed, and portions of the intrinsic semiconductor 154 under the ohmic contact islands 163 and 165 are exposed by removing a part of the extrinsic semiconductor 164 that is not covered with the data line 171 and the drain electrode 175. It is preferable that an oxygen plasma process is performed later to stabilize a surface of the exposed portions of the intrinsic semiconductor 154.

Figure 11:
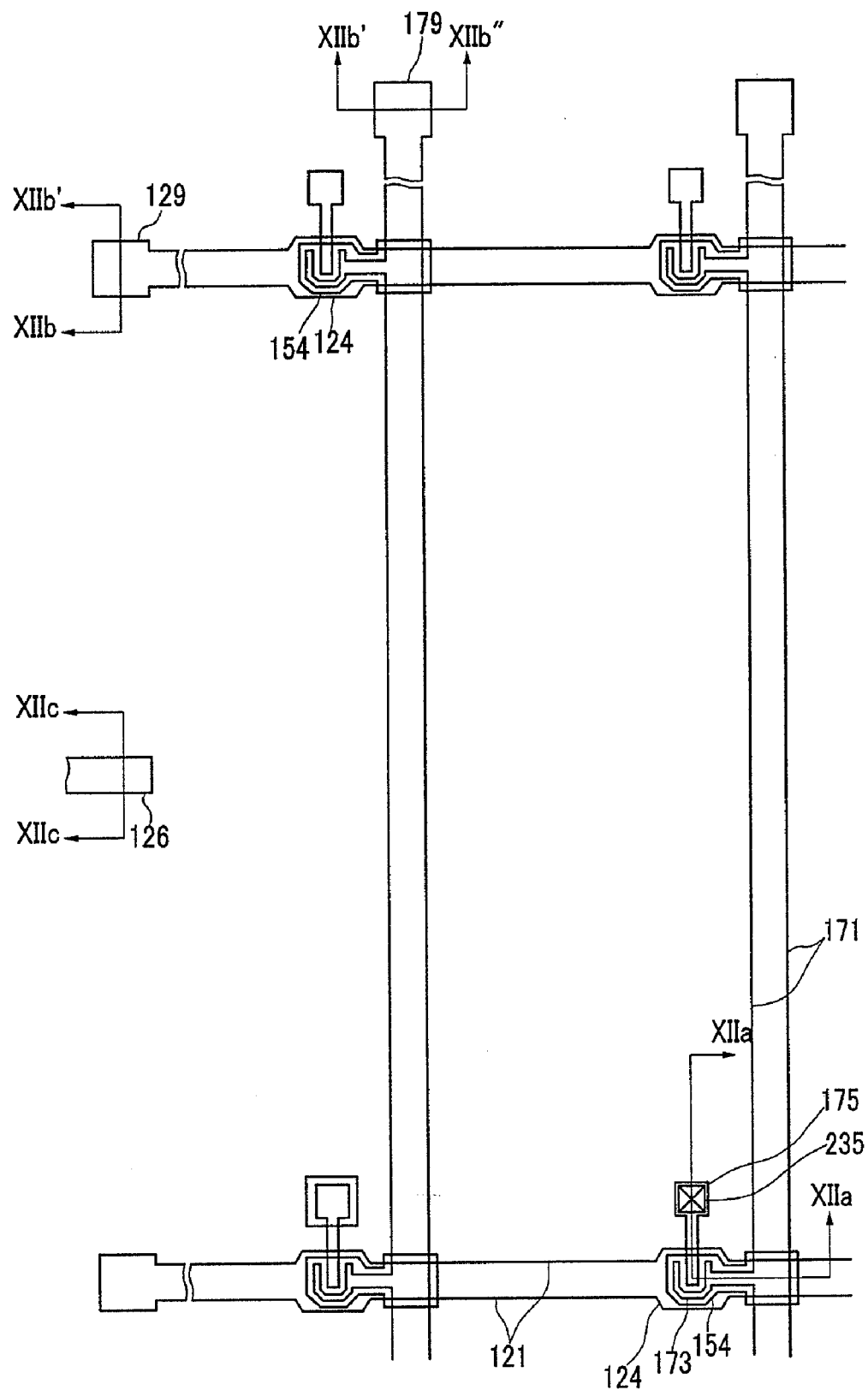
Figure 12A:
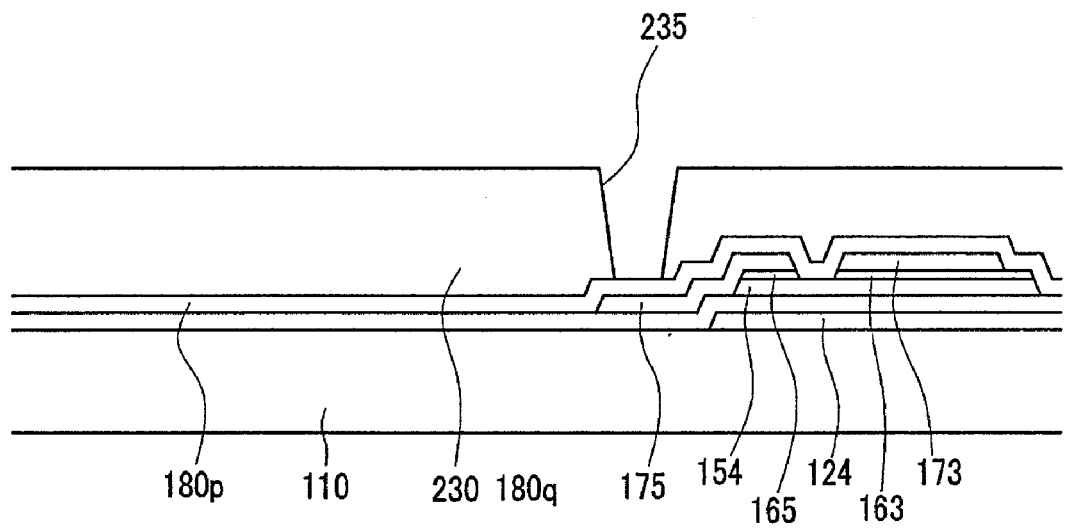
FIGS. 12A to 12C are cross-sectional views of the thin film transistor array panel taken along lines XIIa-XIIa, XIIb-XIIb'-XIIb", and XIIc-XIIc of FIG. 11, respectively.
Figure 12B:
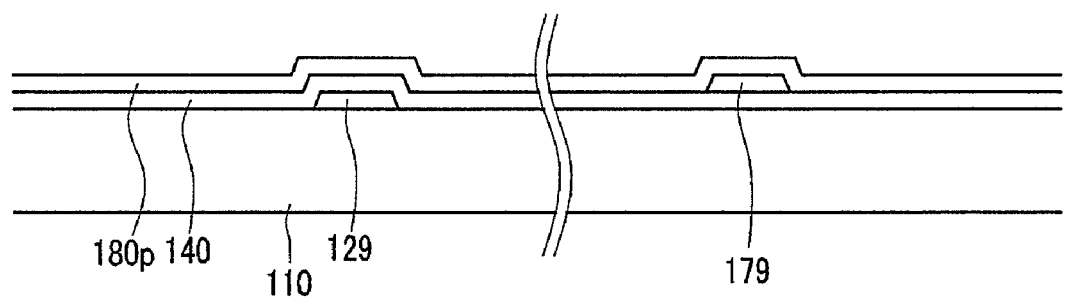
Figure 12C:
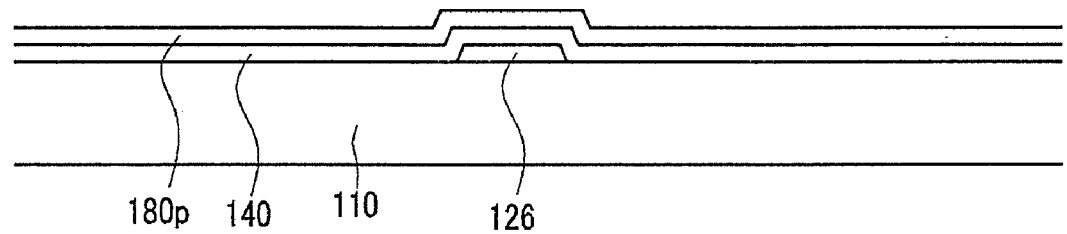

As shown in FIGS. 11 to 12C, the lower passivation layer 180$p$ is formed by stacking an inorganic insulating layer such as silicon nitride, and the color filter 230 having the opening 235 for exposing the lower passivation layer 180$p$ on the upper part of the drain electrode 175 is formed on the upper part of the lower passivation layer 180$p$. The color filter 230 includes red, green, and blue color filters that are sequentially disposed in each pixel, and each color filter is sequentially formed by exposing and developing an organic film with a photolithography process after coating a negative photosensitivity organic film including red, green, and blue color pigment.

Figure 13:
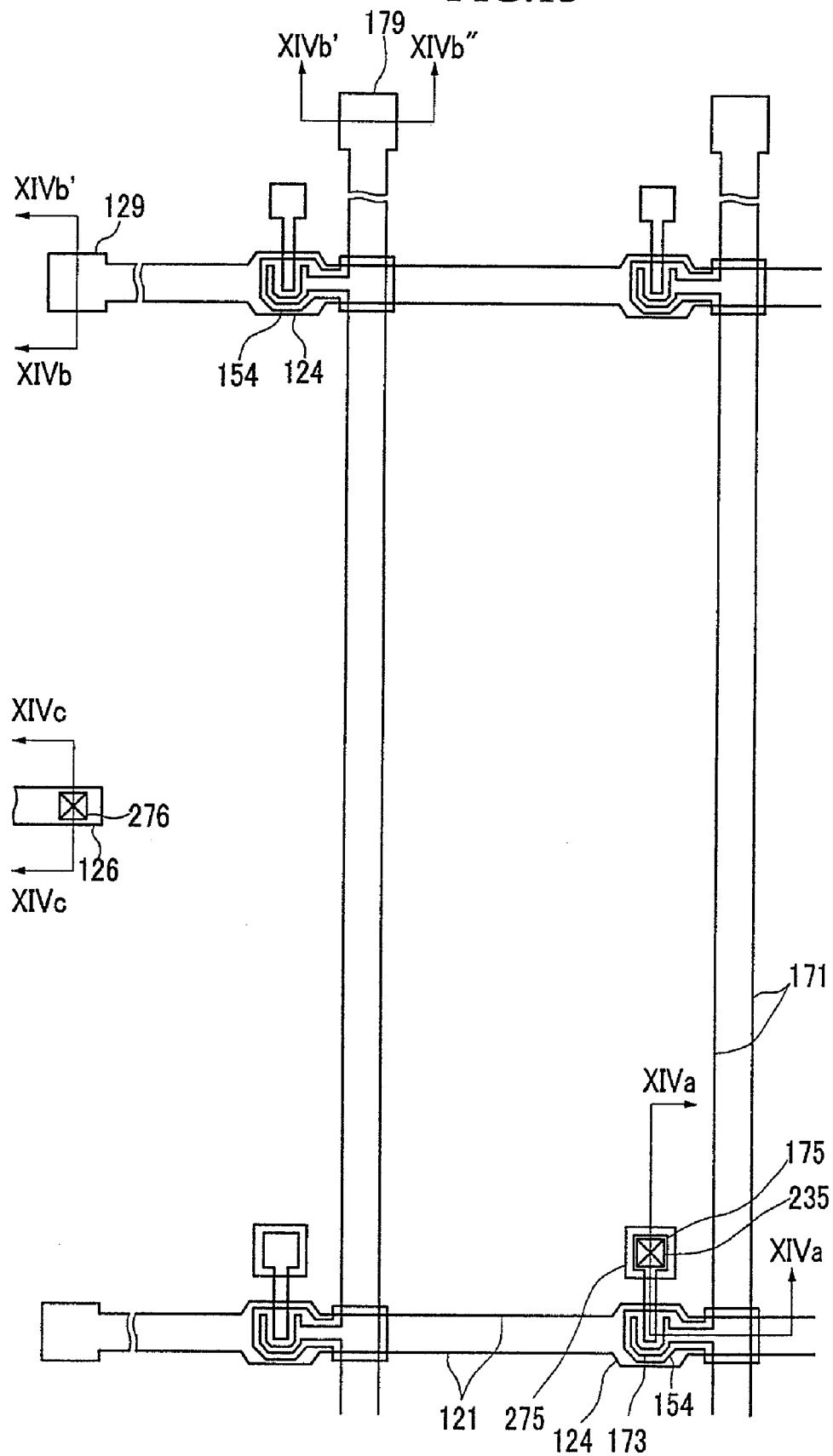
Figure 14A:
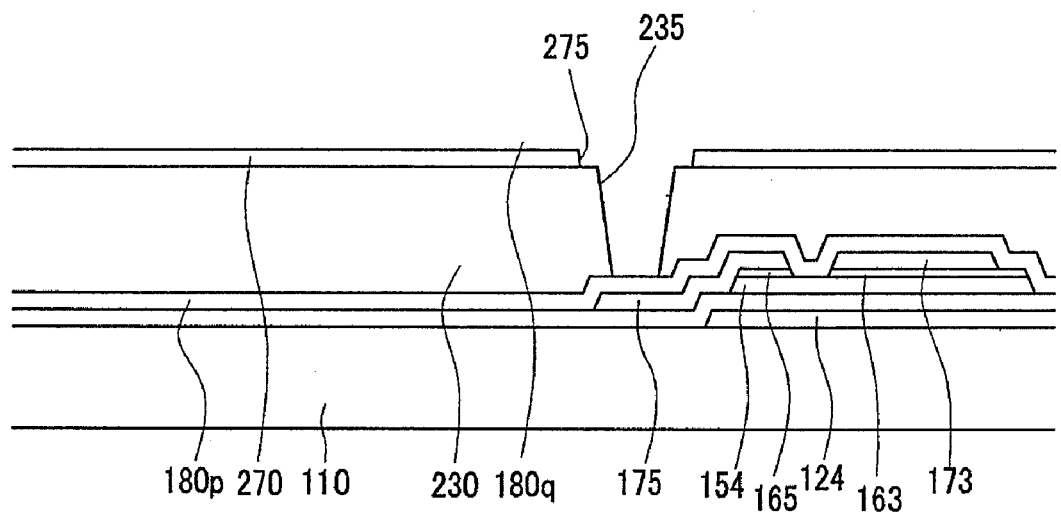
FIGS. 14A to 14C are cross-sectional views of the thin film transistor array panel taken along lines XIVa-XIVa, XIVb-XIVb'-XIVb", and XIVc-XIVc of FIG. 13, respectively.
Figure 14B:
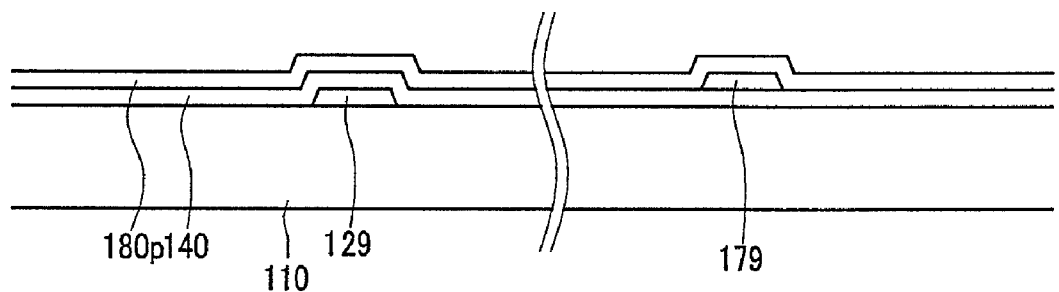
Figure 14C:
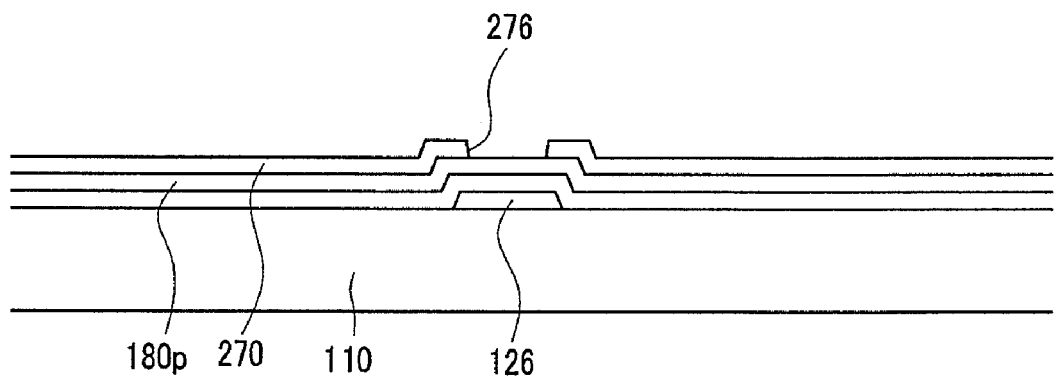

As shown in FIGS. 13 to 14C, a transparent conductive material such as poly-crystalline, mono-crystalline, or amorphous ITO and IZO is stacked on the upper part of the color filter 230, and the common electrode 270 having the opening 275 for exposing the opening 235 of the color filter 230 and the contact hole 276 for exposing the lower passivation layer 180$p$ on an upper part of the common signal line 126 are formed by patterning with a photolithography process using a mask. Because a low temperature process can be used and deposition is performed in an amorphous state when forming the common electrode 270 with amorphous ITO or IZO, adhesive strength of the common electrode 270 with an organic material such as the color filter 230 can be improved.

Figure 15:
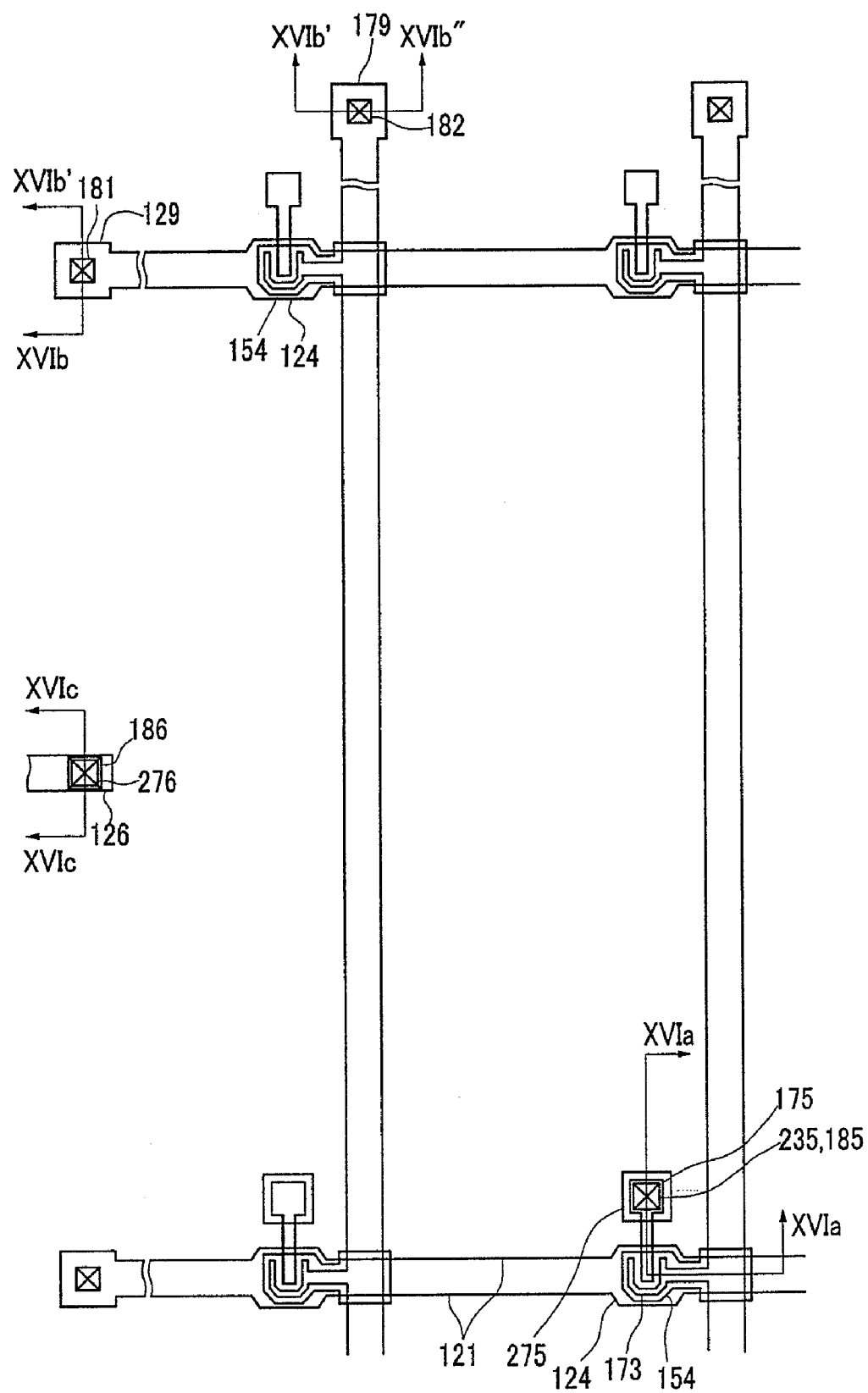
Figure 16A:
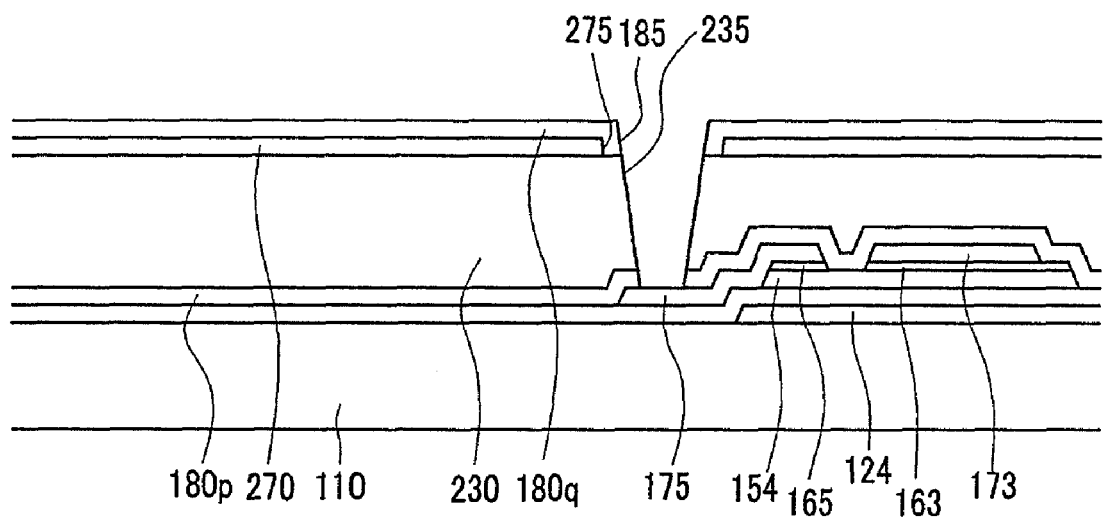
FIGS. 16A to 16C are cross-sectional views of the thin film transistor array panel taken along lines XVIa-XVIa, XVIb-XVIb'-XVIb", and XVIc-XVIc of FIG. 15, respectively.
Figure 16B:
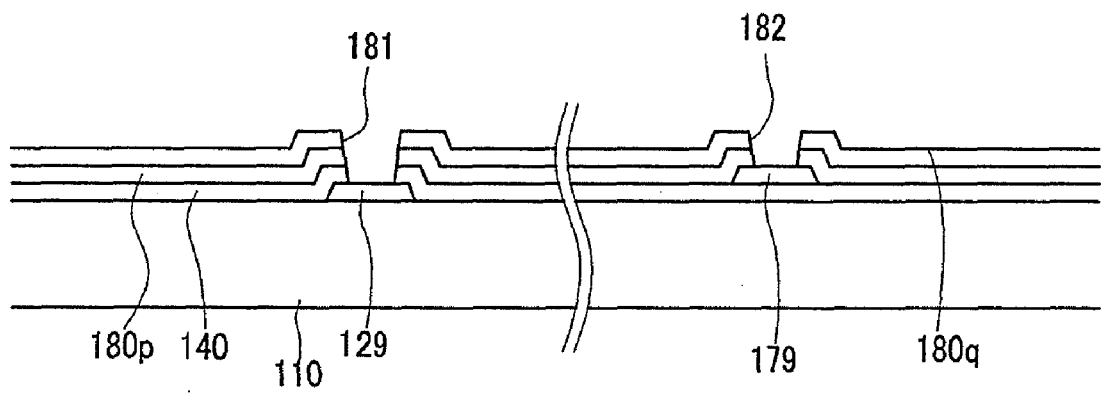
Figure 16C:
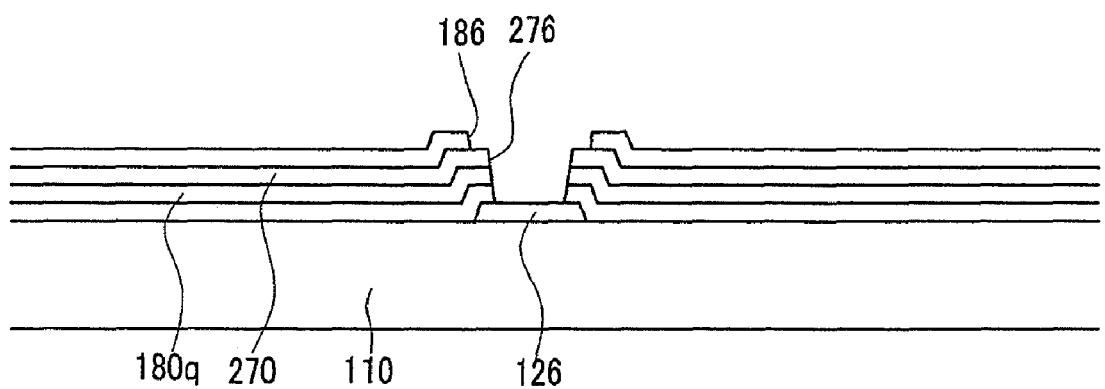

As shown in FIGS. 15 to 16C, the contact hole 185 for exposing the drain electrode 175 through the opening 235 of the color filter 230, and the contact holes 181 and 182 for exposing the end parts 129 and 179 of the gate line 121 and the data line 171 are formed by coating an organic insulating material on the upper part of the common electrode 270 and patterning the material with the gate insulating layer 140 or the lower passivation layer 180p with a photolithography process. The contact hole 186 is also formed, and the common signal line 126 and the common electrode 270 are exposed through the contact hole 186 by etching the lower passivation layer 180p and the gate insulating layer 140 that are exposed through the contact hole 276 of the common electrode 270 and the contact hole 186. The upper passivation layer 180q is formed of a BCB organic material or an acryl organic material having excellent planarization characteristics. The BCB organic material can be coated to have a uniform thickness of about 1.5 µm. Because an acryl organic material has photosensitivity, it can be used as an etching mask for etching lower layers to be performed later.

As described above with reference to FIGS. 1 to 4, a transparent conductive material such as ITO or IZO is deposited on the upper passivation layer 180q, and the pixel electrode 191 and contact assistants 81, 82, and 86 are formed by etching with a photolithography process using a mask.

In a method of manufacturing a thin film transistor array panel according to an exemplary embodiment of the present invention, the gate line 121 can be prevented from being damaged by an ITO or IZO etching liquid when forming the common electrode 270 and the pixel electrode 191 after forming the color filter 230.

In the thin film transistor array panel according to an exemplary embodiment of the present invention, an aperture ratio of a pixel can be increased and vertical line blurs can be prevented by reducing erroneous alignment of the display panels and reducing a size of the thin film transistor array panel.

Furthermore, in a method of manufacturing the thin film transistor array panel according to an exemplary embodiment of the present invention, the signal line can be prevented from being damaged by an ITO or IZO etching liquid when forming a color filter between a signal line and a common electrode and a pixel electrode. In addition, an upper passivation layer can be used as a mask by forming the upper passivation layer with a photosensitivity material, thus simplifying the manufacturing process.

While the present invention has been described in detail with reference to the exemplary embodiments, those skilled in the art will appreciate that various modifications and substitutions can be made thereto without departing from the spirit and scope of the present invention as set forth in the appended claims.

What is claimed is:

1. A thin film transistor array panel comprising:
    a substrate;
    a gate line disposed on the substrate;
    a data line intersecting the gate line;
    a thin film transistor connected to the gate line and the data line;
    a color filter disposed on upper parts of the gate line, the data line, and the thin film transistor;
    a first electrode disposed on the color filter and comprising a transparent conductor;
    a passivation layer disposed on an upper part of the first electrode; and
    a second electrode disposed on an upper part of the passivation layer and connected to a drain electrode of the thin film transistor,
    wherein the second electrode comprises a plurality of branch electrodes inclined at an angle to the gate line or the data line, and a connection part connecting the plurality of branch electrodes,
    wherein the color filter comprises an opening and the passivation layer comprises a first contact hole to contact the drain electrode with the second electrode.

2. The thin film transistor array panel of claim 1, wherein the branch electrodes are arranged symmetrically around a center line of the second electrode that is parallel to the gate line.

3. The thin film transistor array panel of claim 1, wherein the first electrode has a planar shape.

4. The thin film transistor array panel of claim 3, wherein the first electrode comprises an opening exposing a part of the color filter on an upper part of the drain electrode.

5. The thin film transistor array panel of claim 4, wherein the passivation layer covers at least one part of the opening of the first electrode.

6. The thin film transistor array panel of claim 1, further comprising a signal line that is formed in a same layer as the gate line and that is electrically connected to the second electrode.

7. The thin film transistor array panel of claim 6, further comprising a contact member,
    wherein the passivation layer comprises a second contact hole and the first electrode comprises a third contact hole that exposes the common signal line through the second contact hole,
    wherein the contact member for connecting the signal line and the first electrode through the second and third contact holes is disposed in a same layer as the second electrode.

8. The thin film transistor array panel of claim 7, wherein the contact member is disposed in a non-display area.

9. A thin film transistor array panel comprising:
    a substrate;
    a gate line disposed on the substrate;
    a data line intersecting the gate line;
    a thin film transistor connected to the gate line and the data line;
    a color filter disposed on the gate line, the data line, and the thin film transistor;
    a first electrode disposed on the color filter;
    a passivation layer disposed on the first electrode;
    a second electrode disposed on the passivation layer and connected to a drain electrode of the thin film transistor; and
    a common signal line that is disposed in a same layer as the gate line and that is electrically connected to the first electrode,
    wherein the second electrode comprises a plurality of branch electrodes inclined at an angle to the gate line or the data line, and a connection part for connecting the plurality of branch electrodes.

10. The thin film transistor array panel of claim 9, wherein the branch electrodes are arranged symmetrically around a center line of the second electrode that is parallel to the gate line.

11. The thin film transistor array panel of claim 10, wherein the color filter comprises an opening and the passivation layer comprises a first contact hole to contact the drain electrode with the second electrode.

12. The thin film transistor array panel of claim 9, wherein the first electrode has a planar shape.

13. The thin film transistor array panel of claim 12, wherein the first electrode comprises an opening exposing a part of the color filter on an upper part of the drain electrode.

14. The thin film transistor array panel of claim 13, wherein the passivation layer covers at least one part of the opening of the first electrode.

15. The thin film transistor array panel of claim 9, further comprising a contact member,
wherein the passivation layer comprises a second contact hole and the first electrode comprises a third contact hole that exposes the signal line through the second contact hole,
wherein the contact member for connecting the signal line and the first electrode through the second and third contact holes is disposed in a same layer as the second electrode.

16. The thin film transistor array panel of claim 15, wherein the contact member is disposed in a non-display area.

17. A thin film transistor array panel comprising:
a substrate;
a gate line disposed on the substrate;
a data line intersecting the gate line;
a thin film transistor connected to the gate line and the data line;
a color filter disposed on the gate line, the data line, and the thin film transistor;
a first electrode disposed on the color filter;
a passivation layer disposed on the first electrode;
a second electrode disposed on an upper part of the passivation layer and connected to a drain electrode of the thin film transistor; and
a common signal line that is disposed in a same layer as the gate line and that is electrically connected to the first electrode,
wherein the color filter comprises an opening and the passivation layer comprises a first contact hole to contact the drain electrode with the second electrode.

18. The thin film transistor array panel of claim 17, wherein the second electrode comprises a plurality of branch electrodes inclined at an angle to the gate line or the data line, and a connection part connecting the plurality of branch electrodes.

19. The thin film transistor array panel of claim 18, wherein the branch electrodes are arranged symmetrically around a center line of the second electrode that is parallel to the gate line.

20. The thin film transistor array panel of claim 17, wherein the first electrode has a planar shape.

21. The thin film transistor array panel of claim 20, wherein the first electrode comprises an opening exposing a part of the color filter on an upper part of the drain electrode.

22. The thin film transistor array panel of claim 21, wherein the passivation layer covers at least one part of the opening of the first electrode.

23. The thin film transistor array panel of claim 17, further comprising a contact member,
wherein the passivation layer comprises a second contact hole and the first electrode comprises a third contact hole that exposes the signal line through the second contact hole,
wherein the contact member for connecting the signal line and the first electrode through the second and third contact holes is disposed in a same layer as the second electrode.

24. The thin film transistor array panel of claim 23, wherein the contact member is disposed in a non-display area.

25. A thin film transistor array panel comprising:
a substrate;
a gate line disposed on the substrate;
a data line intersecting the gate line;
a thin film transistor connected to the gate line and the data line;
a color filter disposed on the gate line, the data line, and the thin film transistor;
a first electrode disposed on the color filter;
a passivation layer disposed on the first electrode;
a second electrode disposed on an upper part of the passivation layer and connected to a drain electrode of the thin film transistor; and
a common signal line that is disposed in a same layer as the gate line and that is electrically connected to the first electrode,
wherein the second electrode comprises a plurality of branch electrodes inclined at an angle to the gate line or the data line, and a connection part connecting the plurality of branch electrodes,
wherein the color filter comprises an opening and the passivation layer comprises a first contact hole to contact the drain electrode with the second electrode.

26. The thin film transistor array panel of claim 25, wherein the branch electrodes are arranged symmetrically around a center line of the second electrode that is parallel to the gate line.

27. The thin film transistor array panel of claim 25, wherein the first electrode has a planar shape.

28. The thin film transistor array panel of claim 25, wherein the first electrode comprises an opening exposing a part of the color filter on an upper part of the drain electrode.

29. The thin film transistor array panel of claim 28, wherein the passivation layer covers at least one part of the opening of the first electrode.

30. The thin film transistor array panel of claim 25, further comprising a contact member,
wherein the passivation layer comprises a second contact hole and the first electrode comprises a third contact hole that exposes the signal line through the second contact hole,
wherein the contact member for connecting the signal line and the first electrode through the second and third contact holes is disposed in a same layer as the second electrode.

31. The thin film transistor array panel of claim 30, wherein the contact member is disposed in a non-display area.

32. A thin film transistor array panel comprising:
a substrate;
a gate line disposed on the substrate;
a data line intersecting the gate line;
a thin film transistor connected to the gate line and the data line;
a color filter disposed on the gate line, the data line, and the thin film transistor;
a first electrode disposed on the color filter;
a passivation layer disposed on the first electrode;
a second electrode disposed on the passivation layer and connected to a drain electrode of the thin film transistor; and a common signal line that is disposed in a same layer as the data line and that is electrically connected to the first electrode, wherein the second electrode comprises a plurality of branch electrodes inclined at an angle to the gate line or the data line, and a connection part for connecting the plurality of branch electrodes.

33. The thin film transistor array panel of claim 32, wherein the branch electrodes are arranged symmetrically around a center line of the second electrode that is parallel to the gate line.

34. The thin film transistor array panel of claim 33, wherein the color filter comprises an opening and the passivation layer comprises a first contact hole to contact the drain electrode with the second electrode.

35. The thin film transistor array panel of claim 32, wherein the first electrode has a planar shape.

36. The thin film transistor array panel of claim 35, wherein the first electrode comprises an opening exposing a part of the color filter on an upper part of the drain electrode.

37. The thin film transistor array panel of claim 36, wherein the passivation layer covers at least one part of the opening of the first electrode.

38. The thin film transistor array panel of claim 32, further comprising a contact member, wherein the passivation layer comprises a second contact hole and the first electrode comprises a third contact hole that exposes the signal line through the second contact hole, wherein the contact member for connecting the signal line and the first electrode through the second and third contact holes is disposed in a same layer as the second electrode.

39. The thin film transistor array panel of claim 38, wherein the contact member is disposed in a non-display area.

40. A thin film transistor array panel comprising:
a substrate;
a gate line disposed on the substrate;
a data line intersecting the gate line;
a thin film transistor connected to the gate line and the data line;
a color filter disposed on the gate line, the data line, and the thin film transistor;
a first electrode disposed on the color filter;
a passivation layer disposed on the first electrode;
a second electrode disposed on an upper part of the passivation layer and connected to a drain electrode of the thin film transistor; and
a common signal line that is disposed in a same layer as the data line and that is electrically connected to the first electrode,
wherein the color filter comprises an opening and the passivation layer comprises a first contact hole to contact the drain electrode with the second electrode.

41. The thin film transistor array panel of claim 40, wherein the second electrode comprises a plurality of branch electrodes inclined at an angle to the gate line or the data line, and a connection part connecting the plurality of branch electrodes.

42. The thin film transistor array panel of claim 41, wherein the branch electrodes are arranged symmetrically around a center line of the second electrode that is parallel to the gate line.

43. The thin film transistor array panel of claim 40, wherein the first electrode has a planar shape.

44. The thin film transistor array panel of claim 43, wherein the first electrode comprises an opening exposing a part of the color filter on an upper part of the drain electrode.

45. The thin film transistor array panel of claim 44, wherein the passivation layer covers at least one part of the opening of the first electrode.

46. The thin film transistor array panel of claim 40, further comprising a contact member, wherein the passivation layer comprises a second contact hole and the first electrode comprises a third contact hole that exposes the signal line through the second contact hole, wherein the contact member for connecting the signal line and the first electrode through the second and third contact holes is disposed in a same layer as the second electrode.

47. The thin film transistor array panel of claim 46, wherein the contact member is disposed in a non-display area.

48. A thin film transistor array panel comprising:
a substrate;
a gate line disposed on the substrate;
a data line intersecting the gate line;
a thin film transistor connected to the gate line and the data line;
a color filter disposed on the gate line, the data line, and the thin film transistor;
a first electrode disposed on the color filter;
a passivation layer disposed on the first electrode;
a second electrode disposed on an upper part of the passivation layer and connected to a drain electrode of the thin film transistor; and
a common signal line that is disposed in a same layer as the data line and that is electrically connected to the first electrode,
wherein the second electrode comprises a plurality of branch electrodes inclined at an angle to the gate line or the data line, and a connection part connecting the plurality of branch electrodes,
wherein the color filter comprises an opening and the passivation layer comprises a first contact hole to contact the drain electrode with the second electrode.

49. The thin film transistor array panel of claim 48, wherein the branch electrodes are arranged symmetrically around a center line of the second electrode that is parallel to the gate line.

50. The thin film transistor array panel of claim 48, wherein the first electrode has a planar shape.

51. The thin film transistor array panel of claim 48, wherein the first electrode comprises an opening exposing a part of the color filter on an upper part of the drain electrode.

52. The thin film transistor array panel of claim 51, wherein the passivation layer covers at least one part of the opening of the first electrode.

53. The thin film transistor array panel of claim 48, further comprising a contact member, wherein the passivation layer comprises a second contact hole and the first electrode comprises a third contact hole that exposes the signal line through the second contact hole, wherein the contact member for connecting the signal line and the first electrode through the second and third contact holes is disposed in a same layer as the second electrode.

54. The thin film transistor array panel of claim 53, wherein the contact member is disposed in a non-display area.

55. A thin film transistor array panel comprising:
a substrate;
a gate line that is formed on the substrate;
a data line that intersects the gate line;
a thin film transistor that is connected to the gate line and the data line;
a plurality of color filters that are disposed on the gate line, the data line, and the thin film transistor;
a common electrode that is disposed on the color filter and that includes a transparent conductor;
a passivation layer that is disposed on the common electrode; and
a pixel electrode that is disposed on the passivation layer and that is connected to a drain electrode of each of the thin film transistors,
wherein a side wall of the color filters is disposed on an upper part of the date line.

56. The thin film transistor array panel of claim 55, wherein neighboring edges of the color filters become flat by overlapping each other.

57. The thin film transistor array panel of claim 56, wherein the neighboring edges of the color filters are used as a light blocking member for blocking light.

* * * * *